(12) United States Patent
Hong

(10) Patent No.: US 6,522,020 B2
(45) Date of Patent: Feb. 18, 2003

(54) WAFER-LEVEL PACKAGE

(75) Inventor: Sung Hak Hong, Kyoungki-do (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 9 days.

(21) Appl. No.: 09/735,640

(22) Filed: Dec. 14, 2000

(65) Prior Publication Data

US 2001/0005040 A1 Jun. 28, 2001

(30) Foreign Application Priority Data

Dec. 14, 1999 (KR) ........................................ 1999-57549

(51) Int. Cl.$^7$ ................................................ H01L 23/48
(52) U.S. Cl. ........................ 257/782; 257/668; 257/782
(58) Field of Search ................... 257/668, 735, 257/782

(56) References Cited

U.S. PATENT DOCUMENTS 6,271,586 B1 * 8/2001 Shen ........................... 257/723

* cited by examiner

Primary Examiner—Fetsum Abraham
Assistant Examiner—Leonardo Andujar
(74) Attorney, Agent, or Firm—Pillsbury Winthrop LLP

(57) ABSTRACT

Disclosed is a wafer-level package. The disclosed wafer-level package includes a semiconductor chip provided at a top surface thereof with a plurality of bond pads, a substrate bonded to the top surface of the semiconductor chip and provided with recess portions at each of opposite edge portions thereof not facing the bond pads while being provided with metal lines each extending to a portion of the substrate, arranged adjacent to an associated one of the bond pads, to a bottom surface of an associated one of the recess portions, metal wires electrically connecting the bond pads to the metal lines, respectively, a lead frame having inner leads each firmly fitted in an associated one of the recess portions of the substrate and electrically connected to an associated one of the metal lines by a solder, and outer leads formed to have a step structure, and an encapsulation material completely encapsulating the top surface of the semiconductor chip including the substrate and the metal wires while allowing only the outer leads of the lead frame to be exposed.

8 Claims, 4 Drawing Sheets

WAFER-LEVEL PACKAGE

BACKGROUND OF THE INVENTION

1. Field of the Invention

The present invention relates to a wafer-level package, and more particularly to a wafer-level package manufactured using a substrate and a lead frame to achieve improved reliability.

2. Description of the Related Art

Typically, semiconductor packages are manufactured by sawing a wafer to separate the individual semiconductor chips that had been simultaneously processed in the wafer state and then packaging the individual semiconductor chips. Taking into consideration the number of semiconductor chips obtained from one wafer, this typical package manufacturing method has drawbacks including a lengthened manufacturing time because the packaging process involves a number of unit processing steps such as die attaching, wire bonding, molding, trimming, and forming.

In order to solve these drawbacks, a new package manufacturing method has been proposed, in which a packaging process is preferentially carried out at a wafer level, with the individual devices being separated during subsequent steps. Semiconductor packages manufactured using such a method are called "wafer-level packages".

Referring to FIG. 1, a conventional wafer-level package is illustrated. As shown in FIG. 1, a lower insulating layer 3, which may be made of a dielectric material, is first coated over a wafer and the semiconductor chips 1 on that wafer. The bond pads 2 of each semiconductor chip 1 are then exposed by forming via holes in the lower dielectric layer 3 using conventional photolithography and etching processes. Metal patterns 4 associated with the semiconductor chips 1 are then formed on the lower dielectric layer 3 using conventional metal film deposition and etching processes such that each metal pattern 4 contacts the via holes over the bond pads 2 of the associated semiconductor chip 1. An upper dielectric layer 5 is then formed over the metal patterns 4 and the exposed portion of the lower dielectric layer 3. Portions of each metal pattern 4 remote from the bond pads 2 of the associated semiconductor chip 1 are then exposed through holes formed in the upper dielectric layer 5 using conventional photolithography and etching processes. The exposed portions of each metal pattern 4 define the ball lands on which solder balls 7 are to be mounted. Solder balls 7 are then mounted on the ball lands of each metal pattern 4. In order to enhance the bonding strength of the solder balls 7, an under bump metallurgy (UBM) layer 6 is formed on each ball land prior to the mounting of the solder balls 7. The UBM layer 6 is made of a metal. This UBM layer 6 comes into contact with both the exposed ball land of the associated metal pattern 4 and the upper dielectric layer 5.

All the above mentioned processing steps are carried out at the wafer level. The wafer is then sawn into individual semiconductor chips along scribe lines provided on the wafer. Thus, wafer-level packages are completely formed.

However, such a conventional wafer-level packaging is subject to various problems.

First, mechanical stress is concentrated at the interface between the upper dielectric layer and the UBM layer due to differences in the thermal expansion coefficients of the upper dielectric and UBM layers, comprising a macromolecular polymer and a metal respectively. For this reason, the conventional wafer level package exhibits an unstable and non-uniform signal flow between the semiconductor chip and the external signal input stage. Furthermore, even when the signal flow between the semiconductor chip and the external signal input stage is stable, delamination may occur at the interface between the upper dielectric layer and the UBM layer. Moisture may penetrate into the metal pattern via an interface portion, where the delamination occurs, thereby causing the metal pattern to be eroded. As a result, the signal flow between the semiconductor chip and the external signal input stage may be cut off. Also, the conventional wafer-level package exhibits a low bonding strength. This may result in a further instability of the signal flow between the semiconductor chip and the external signal input stage. Such a low bonding strength of solder balls results from the fact that those solder balls are subjected to severe shear stress as a result of differences in the thermal expansion coefficients of the semiconductor chip (approximately 3 ppm) and the associated circuit board (approximately 14 ppm), thereby causing cracks.

Second, it is difficult to improve the bonding strength of solder balls. Improvements in the solder ball bonding strength may be achieved by increasing the thickness of the primary stress absorbing layer, i.e., the lower insulating layer. However, increasing thickness of the lower insulating layer may result in increased package thickness, difficulty in conducting the etching process to expose the bonding pads, and/or difficulty in achieving good contact between the bond pads and the metal pattern. For this reason, there are practical difficulties in improving the solder ball bonding strength.

Third, it is difficult to apply the conventional wafer-level package to products requiring a high-speed operation. This is because the metal pattern is positioned just above the surface of the semiconductor chip, thereby resulting in an increase in capacitance that interferes with high-speed operation. Meanwhile, such increases in capacitance may be inhibited by increasing the spacing between the semiconductor chip and the metal pattern, that is, the thickness of the lower insulating layer. Again, however, this method involves the above mentioned problems, and so it has not yet been applied.

Fourth, the conventional wafer-level package may involve severe delamination in at the interface between laminated layers during the wafer separation process due to the fact that no encapsulation material is used. In severe cases, damage may occur at edge portion of the semiconductor chip. For this reason, the conventional wafer-level package exhibits degraded reliability and productivity.

SUMMARY OF THE INVENTION

Therefore, an object of the invention is to provide a wafer-level package capable of providing reliable signal flow between a semiconductor chip and an external signal input stage.

Another object of the invention is to provide a wafer-level package applicable to products requiring a high-speed operation.

Another object of the invention is to provide a wafer-level package capable of avoiding or reducing delamination at the interface between laminated elements during a wafer separation processing.

In accordance with the present invention, these objects are accomplished by providing a semiconductor chip having on its top surface a plurality of bond pads; a substrate bonded to the top surface of the semiconductor chip and provided with recess portions at each of opposite edge portions thereof not facing the bond pads while being provided with metal lines each extending to a portion of the substrate, arranged adjacent to an associated one of the bond pads, to a bottom surface of an associated one of the recess portions; metal wires electrically connecting the bond pads to the metal lines, respectively; a lead frame having inner leads each firmly fitted in an associated one of the recess portions of the substrate and electrically connected to an associated one of the metal lines by a solder, and outer leads formed to have a step structure; and an encapsulation material completely encapsulating the top surface of the semiconductor chip including the substrate and the metal wires while allowing only the outer leads of the lead frame to be exposed.

The present invention may be better understood with reference to the detailed description accompanying figures. The figures in particular are only for purposes of illustration and thus do not operate to unduly limit of the present invention.

DESCRIPTION OF THE PREFERRED EMBODIMENTS

Now, an wafer-level package according to an embodiment of the present invention will be described in detail, with reference to the annexed drawings.

Figure 1:
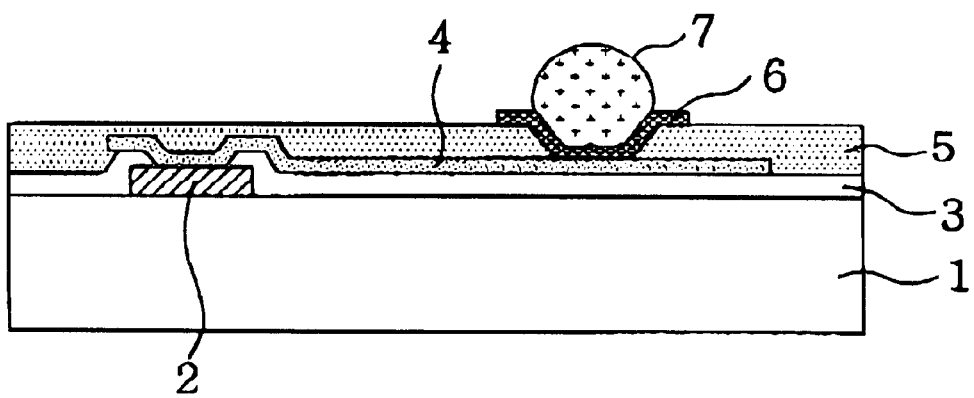
FIG. 1 is a sectional view illustrating a conventional wafer-level package.
Figure 2:
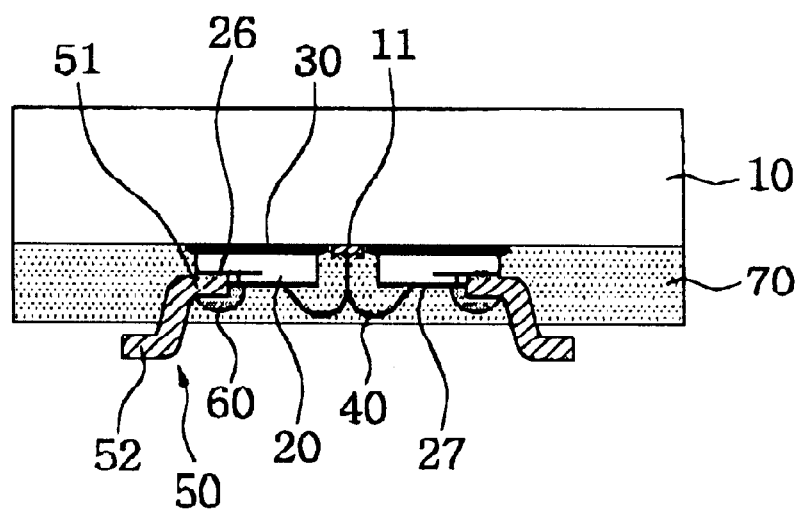
FIG. 2 is a sectional view illustrating a wafer-level package according to an embodiment of the present invention.

FIG. 2 is a sectional view illustrating a wafer-level package according to an embodiment of the present invention. Referring to FIG. 2, one of the many semiconductor chips that are formed on a single wafer is illustrated. The semiconductor chip 10, has bonding pads 11 centrally arranged at the top surface of the semiconductor chip 10. A substrate 20 is bonded to the entire top surface of the semiconductor chips 10 by means of an adhesive 30.

Figure 3:
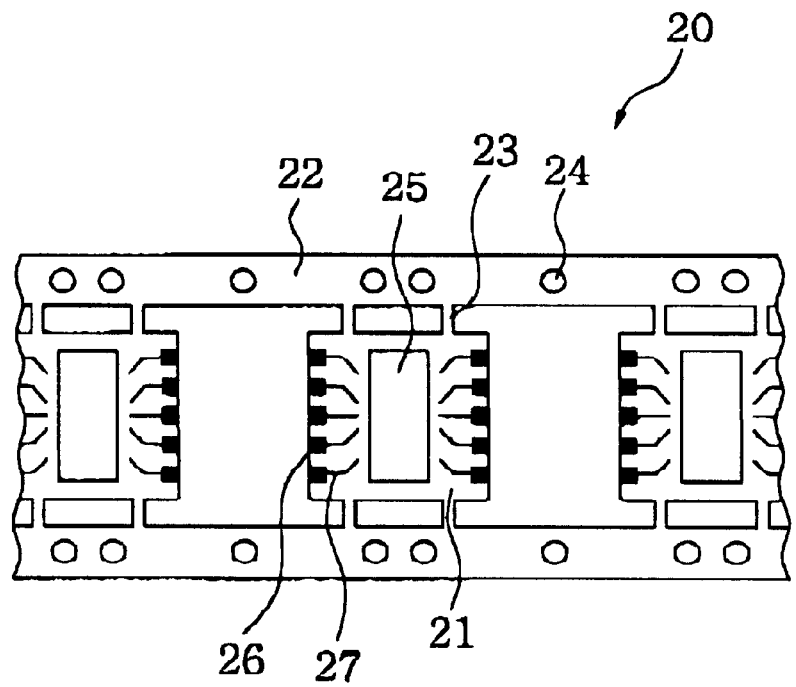
FIG. 3 is a plan view illustrating a substrate according to the embodiment of the present invention.

As shown in FIG. 3, the substrate 20 has a structure in which a plurality of unit substrate bodies 21 corresponding to respective semiconductor chips 10 are aligned with one another in a state uniformly spaced apart from one another while being supported by a pair of side rails 22 having pin holes 24 in a state connected to those side rails 22 by a plurality of tie bars 23. The pin holes 24 serve to provide an alignment of the substrate 20. Each unit substrate body 21 is centrally provided with a slot 25.

Figure 5A:
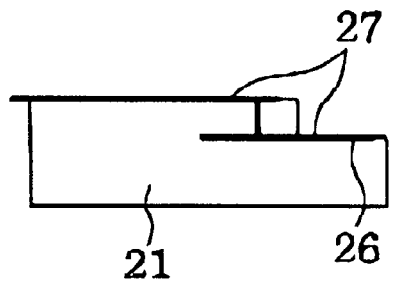
FIGS. 5A to 5C are sectional views respectively illustrating the substrate and lead frame along with a coupling structure thereof according to the embodiment of the present invention.

Each unit substrate body 21 also has a plurality of recess portions 26 aligned together along each lateral edge of the unit substrate body 21 laterally outside the tie bars 23 arranged adjacent thereto. A metal line 27 extends from a portion of the unit substrate body 21 adjacent to the slot 25 to the bottom surface of an associated one of the recess portions 26. This is best shown in FIG. 5A.

Metal lines (not shown) provided at each unit substrate body 21 are electrically interconnected with respective bond pads 11 of an associated one of the semiconductor chips 10 by means of metal wires 40. The metal wires 40 extend through the slot 25 of the unit substrate body 21, and connects the bond pads 11 to the metal lines 27, respectively.

Figure 5B:
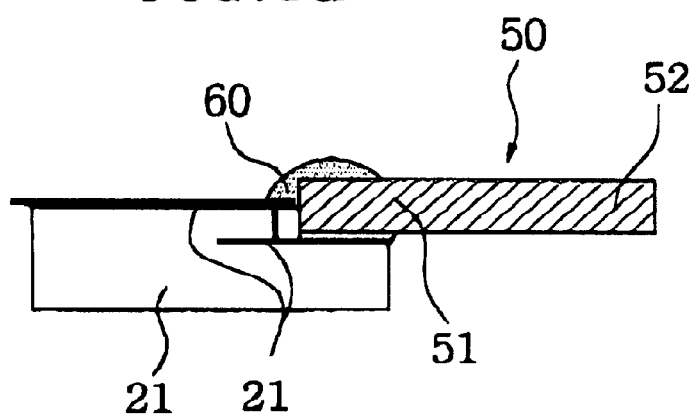
Figure 5C:
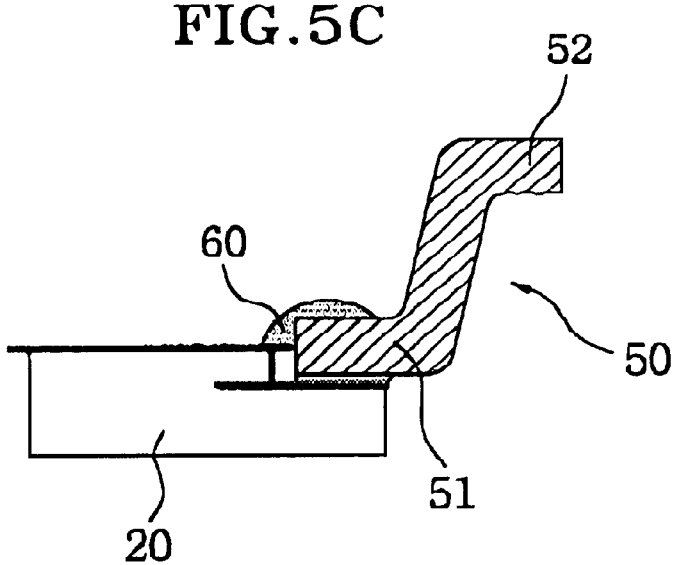

A lead frame 50, which has inner leads 51 and outer leads 55 for each semiconductor chip 10 or each unit substrate body 21, is mounted to the substrate 20. The inner leads 51 are inserted into and fixedly mounted to the recess portions of the unit substrate body 21 by means of solder layers 60, respectively. Each inner lead 51 is electrically connected to an associated one of the metal lines 27. This configuration is best shown in FIG. 5B. Also, the outer leads 51 are subjected to a forming process to have a structure capable of allowing them to be easily mounted on a motherboard. This is best shown in FIG. 5C.

Figure 4:
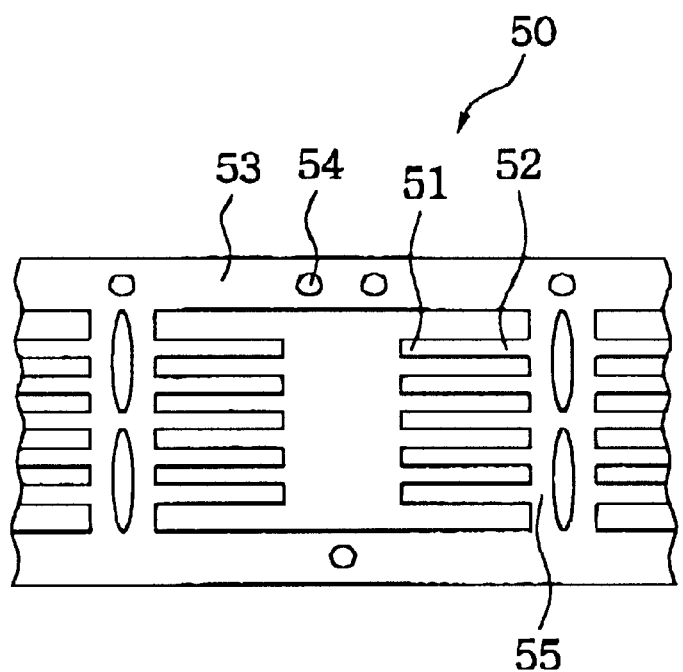
FIG. 4 is a plan view illustrating a lead frame according to the embodiment of the present invention.

As shown in FIG. 4, the lead frame 50 has a structure in which a plurality of junction bars 55, to which a plurality of aligned outer leads 52 are connected, are supported by a pair of side rails 53 extending in parallel to each other while being spaced apart from each other. Each side rail 53 has pin holes 54 at positions corresponding to the pin holes 24 of the substrate 20, respectively.

After the mounting of the lead frame 50 to the substrate 20, the entire top surface of the substrate 20 including the metal wires 40 and the inner leads 51 of the lead frame 50 is encapsulated by an encapsulation material 70 having a uniform thickness. At this time, the side surfaces and bottom surface of each semiconductor chip 10 and the outer leads 52 of the lead frame 50 are outwardly exposed. Typically, each outer lead 52 is completely exposed outwardly of the encapsulation material 70. However, only the side surfaces and bottom surface of each outer lead 52 may be exposed, as described hereinafter.

The above-mentioned elements are formed at the wafer level. After the wafer is sawn along scribe lines, the wafer-level packages according to the illustrated embodiment of the present invention are obtained.

As apparent from the above description, the wafer-level package of the present invention is manufactured using a substrate provided with desired metal lines. Since these metal lines can be easily replaced, they provide a desired reliability. Accordingly, it is possible to obtain stability in the signal flow between the semiconductor chip and the external signal input state.

In the wafer-level package of the present invention, a sufficient distance is provided between the semiconductor chip and the metal lines because the substrate is interposed between them. Accordingly, it is possible to avoid undesirable increases in capacitance, so that the wafer-level package of the present invention can be advantageously applied to products requiring a high-speed operation.

Moreover, in the wafer-level package of the present invention, the bonding strength between the package and the external signal input stage, that is, the motherboard, is improved, as compared to conventional cases. This is because a reliable lead frame is used as a means for mounting the package on the motherboard. Accordingly, it is possible to prevent a cut-off of the signal flow between the semiconductor chip and the external signal input stage.

Also, since the wafer-level package of the present invention is manufactured using an encapsulation material, there is no tendency for delamination to occur at the interface between laminated layers during the wafer separation process. It is also possible to avoid a damage occurring at edge portion of the semiconductor chip. Thus, the present method provides improvements in reliability and productivity of the resulting semiconductor devices.

Figure 6:
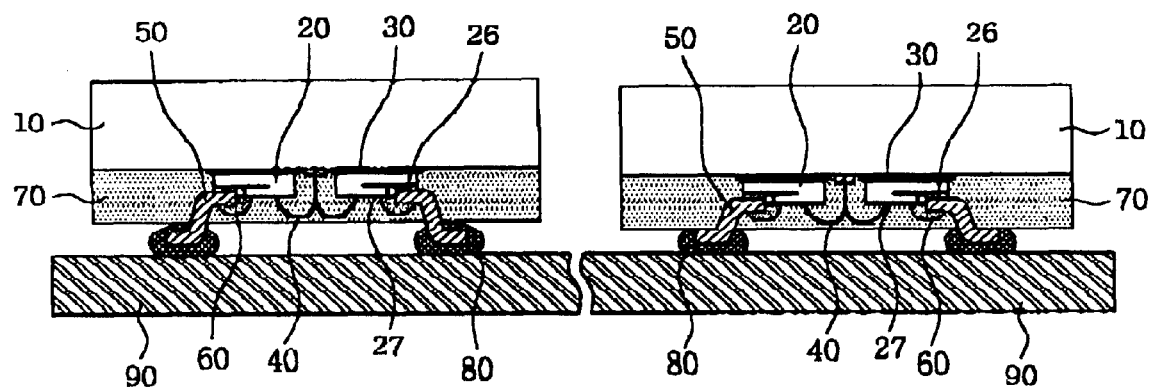
FIG. 6 is a sectional view illustrating a outer lead encapsulating method and a mounting method used for the wafer-level package according to the illustrated embodiment of the present invention.

FIG. 6 is a sectional view illustrating a state in which the wafer-level package of the present invention is mounted on a motherboard 90. The left portion of FIG. 6 shows the case in which the outer leads 52 of the wafer-level package are completely outwardly exposed whereas the right portion of FIG. 6 shows the case in which the outer leads 52 of the wafer-level package are exposed only at their side surfaces and bottom surfaces.

In the case illustrated in the left portion of FIG. 6, the wafer-level package is mounted on the motherboard 90 in such a fashion that the outer leads 52 completely exposed are completely surrounded by solders 80, respectively. On the other hand, in the case illustrated in the right portion of FIG. 6, the wafer-level package is mounted on the motherboard 90 in such a fashion that only the side surfaces and bottom surface of each outer lead 52 outwardly exposed are surrounded by an associated one of the solders 80.

Figure 7:
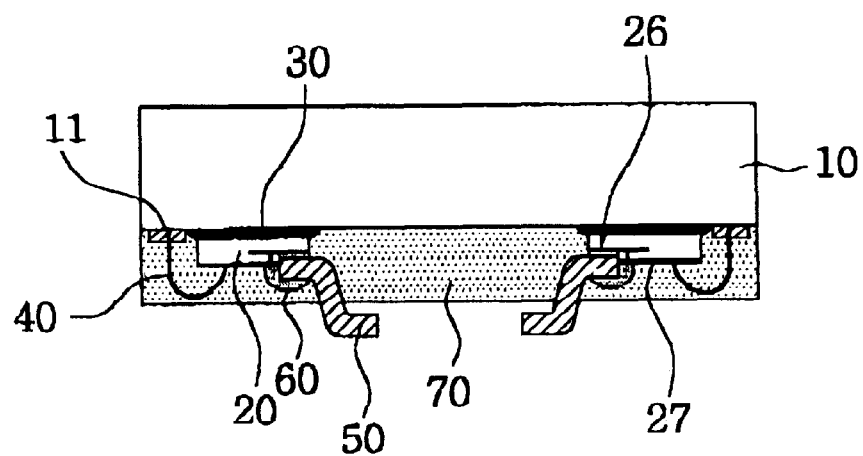
FIG. 7 is a sectional view illustrating a wafer-level package according to another embodiment of the present invention.

FIG. 7 is a sectional view illustrating a wafer-level package according to another embodiment of the present invention. In accordance with this embodiment, the bond pads 11 of each semiconductor chip 10 are arranged on the top surface of the semiconductor chip 10 at opposite lateral edges of the semiconductor chip 10, respectively. In order to cope with such an arrangement of the bond pads 11, the substrate 20 has a structure that has been slightly modified from the structure shown in FIG. 3 that had been suitable for the previous embodiment. The modified substrate structure may be appreciated as illustrated by those skilled in this technical field. Accordingly, no additional description will be provided for the modified substrate structure.

As apparent from the above description, the wafer-level package of the present invention can secure a stable signal flow by virtue of the use of a substrate. Accordingly, this wafer-level package can be advantageously applied to products requiring a high-speed operation. The wafer-level package of the present invention is manufactured using a lead frame. Accordingly, it is possible to obtain an enhanced durability of solder joints. Moreover, the wafer-level package of the present invention is manufactured using an encapsulation material. Accordingly, there is no tendency to delaminate at the interface between laminated layers during the wafer separation process. It is also possible to avoid a damage at edge portion of the semiconductor chip. Thus, improvements in reliability and productivity are secured.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A wafer-level package comprising:

a semiconductor chip having a plurality of bond pads at a top surface thereof;

a substrate bonded to the top surface of the semiconductor chip, and provided with recess portions at each of opposite edge portions thereof not facing the bond pads, said substrate being provided with metal lines each extending from a portion of the substrate arranged adjacent one of the bond pads, to a bottom surface of one of the recess portions;

metal wires electrically connecting the bond pads to the metal lines, respectively;

a lead frame having inner leads each firmly fitted in one of the recess portions of the substrate and electrically connected to one of the metal lines, and outer leads formed to have a step structure extending toward a bottom surface of said wafer-level package and not extending past a lateral edge portion of the semiconductor chip; and an encapsulation material completely encapsulating the top surface of the semiconductor chip including the substrate and the metal wires while allowing only the outer leads of the lead frame to be exposed.

2. The wafer-level package according to claim 1, wherein the bond pads are centrally arranged on the top surface of the semiconductor chip.

3. The wafer-level package according to claim 2, wherein the substrate is further provided with a slot at a portion thereof corresponding to the bond pads of the semiconductor chip.

4. The wafer-level package according to claim 3, wherein the metal wires extend through the slot to connect the bond pads to the metal lines, respectively.

5. The wafer-level package according to claim 1, wherein each of the outer leads is completely exposed from the encapsulation material.

6. The wafer-level package according to claim 1, wherein each of the outer leads is exposed from the encapsulation material only at side surfaces and a bottom surface of the formed step structure thereof.

7. The wafer-level package according to claim 1, wherein the bond pads are arranged on the top surface of the semiconductor chip at opposite edge portions of the semiconductor chip, respectively.

8. The wafer-level package according to claim 7, wherein each of the outer leads is formed to extend toward a central portion of the semiconductor chip.

\* \* \* \* \*